(12) United States Patent
Zevenbergen

(10) Patent No.: US 11,628,663 B2
(45) Date of Patent: Apr. 18, 2023

(54) FLEXOGRAPHIC PRINTING IMAGING WITH LEAD AND TRAIL EDGE STRIPS

(71) Applicant: PMD Dies & Stereos Proprietary Limited, Brakpan (ZA)

(72) Inventor: Leon Mare Zevenbergen, Brakpan (ZA)

(73) Assignee: PMD Dies & Stereos Proprietary Limited, Brakpan (ZA)

( * ) Notice: Subject to any disclaimer, the term of this patent is extended or adjusted under 35 U.S.C. 154(b) by 0 days.

(21) Appl. No.: 17/658,296

(22) Filed: Apr. 7, 2022

(65) Prior Publication Data

US 2022/0324221 A1 Oct. 13, 2022

(51) Int. Cl.
*B41F 5/24* (2006.01)
*B41M 1/04* (2006.01)

(52) U.S. Cl.
CPC .................. *B41F 5/24* (2013.01); *B41M 1/04* (2013.01)

(58) Field of Classification Search
CPC ................ B41F 5/24; B41F 5/20; B41M 1/04
See application file for complete search history.

(56) References Cited

U.S. PATENT DOCUMENTS

| | | | | | |
|---|---|---|---|---|---|
| 5,828,923 | A | * | 10/1998 | Harabin | C02F 1/56 396/626 |
| 6,326,124 | B1 | * | 12/2001 | Alince | G03F 7/2018 430/269 |
| 6,827,019 | B1 | * | 12/2004 | Hieronymus | B41F 30/04 101/415.1 |
| 9,895,859 | B2 | | 2/2018 | Ito | |
| 2004/0025726 | A1 | * | 2/2004 | Vaidyanathan | B41F 27/1206 101/228 |
| 2005/0150406 | A1 | * | 7/2005 | Kanga | B41N 6/00 101/395 |
| 2008/0047447 | A1 | * | 2/2008 | Koberg | H04N 1/0813 101/415.1 |
| 2008/0196614 | A1 | * | 8/2008 | Koberg | B41F 27/1262 101/415.1 |

(Continued)

FOREIGN PATENT DOCUMENTS

| | | |
|---|---|---|
| EP | 0057593 A2 | 8/1982 |
| EP | 0177302 A2 | 4/1986 |
| EP | 2128698 A2 | 12/2009 |

OTHER PUBLICATIONS

International Search Report issued in International Application No. PCT/IB2022/053266 dated Jul. 4, 2022.

*Primary Examiner* — David H Banh
(74) *Attorney, Agent, or Firm* — Vos-IP, LLC

(57) ABSTRACT

A method of forming a digital image on a flexographic printing plate comprising: attaching a portion of photopolymer to a dimensionally stable backing sheet; attaching a lead edge strip and a trail edge strip to said dimensionally stable backing sheet to form a flexographic printing plate; securing the flexographic printing plate comprising a portion of photopolymer to an imaging cylinder by securing the lead edge strip to a lead edge lock formation and securing said trail edge strip to a trail edge lock formation; imparting an image to said portion of photopolymer; and washing said photopolymer to remove unreacted photopolymer and drying said photopolymer to form a processed flexographic printing plate.

17 Claims, 5 Drawing Sheets

(56) References Cited

U.S. PATENT DOCUMENTS

| | | | |
|---|---|---|---|
| 2012/0211924 A1* | 8/2012 | Tutt | B41C 1/05 |
| | | | 264/400 |
| 2012/0212563 A1* | 8/2012 | Tutt | B41J 2/435 |
| | | | 347/225 |
| 2013/0192485 A1* | 8/2013 | Bohm | B41F 27/00 |
| | | | 101/477 |
| 2013/0269557 A1* | 10/2013 | Burberry | B41N 1/12 |
| | | | 264/400 |
| 2014/0299010 A1 | 10/2014 | Messer et al. | |
| 2014/0373742 A1* | 12/2014 | Ramakrishnan | G03F 7/2032 |
| | | | 430/309 |
| 2015/0234280 A1 | 8/2015 | Arnold et al. | |
| 2017/0008269 A1* | 1/2017 | Honda | B41N 1/22 |

* cited by examiner

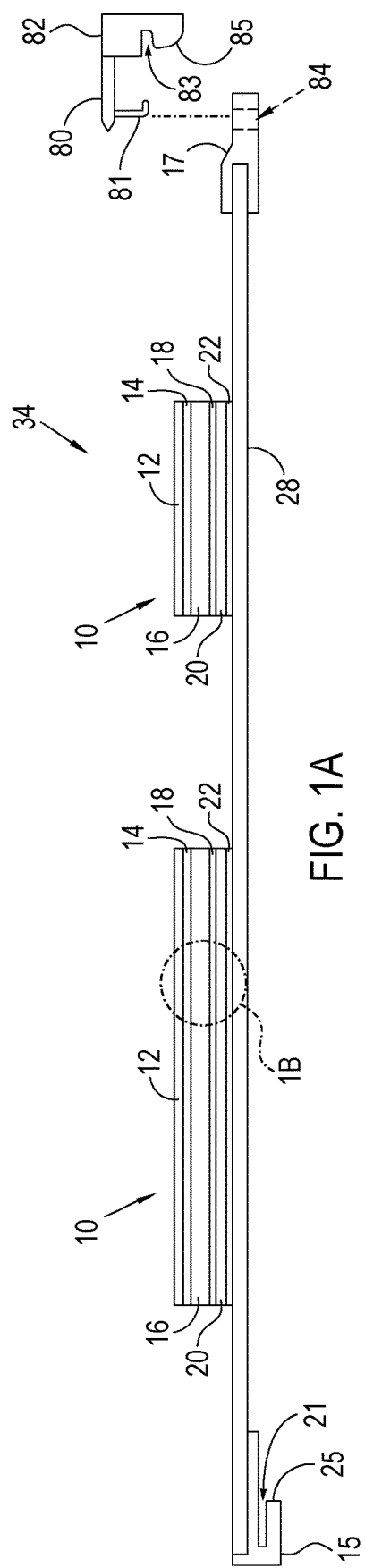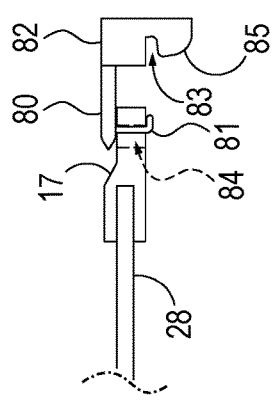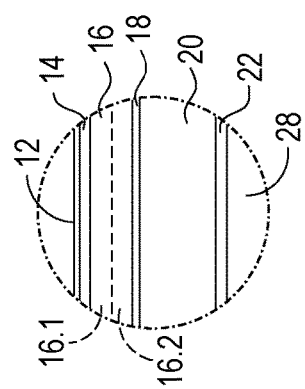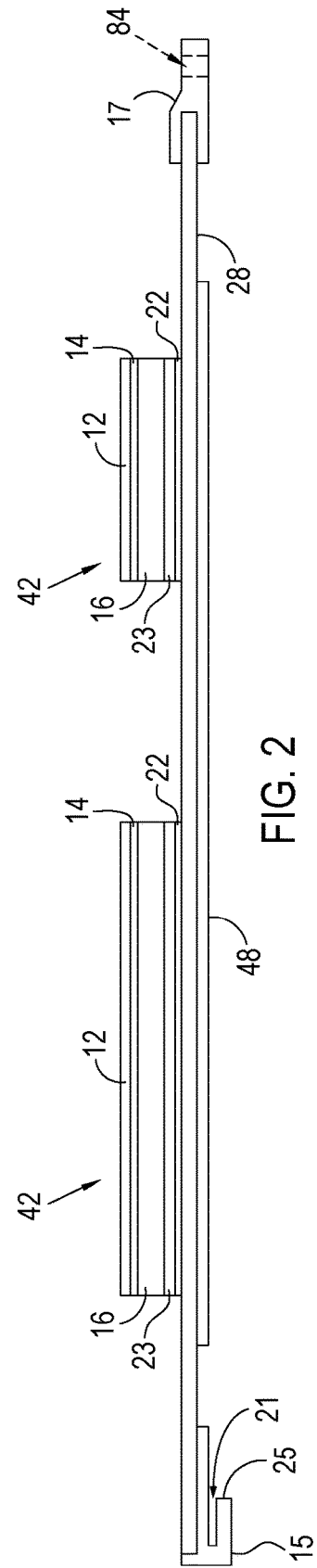

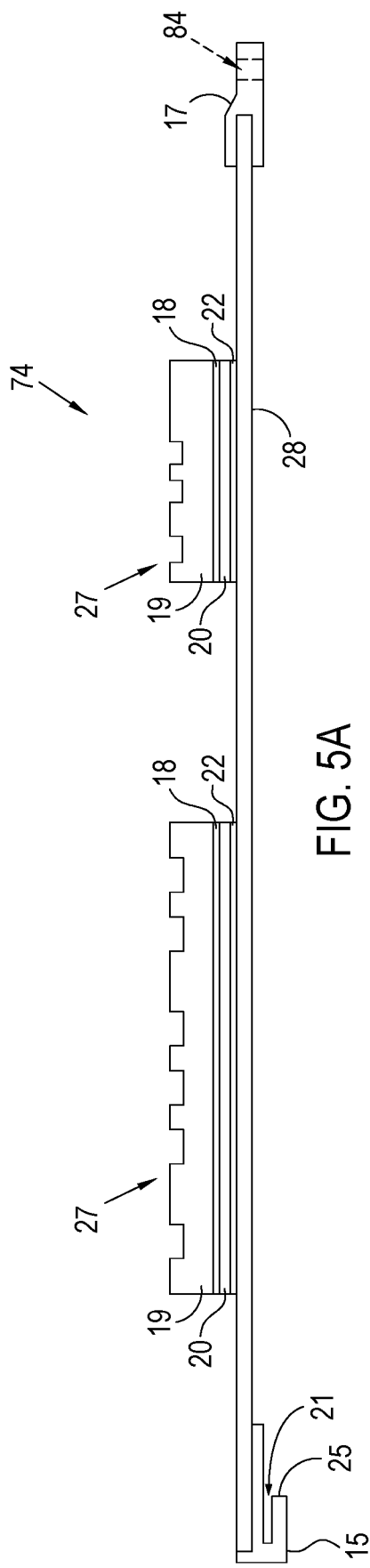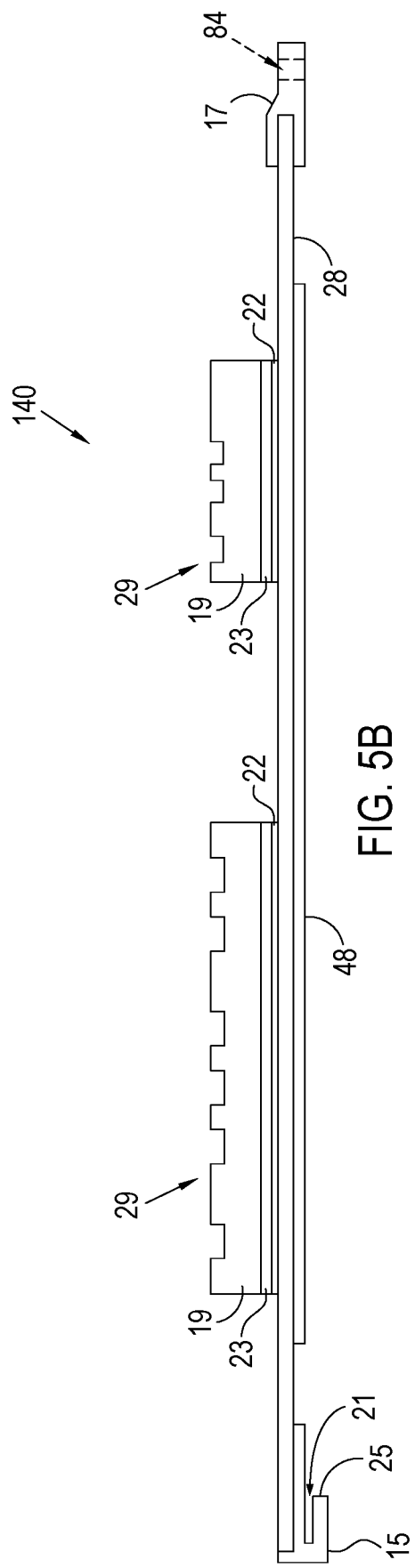

US 11,628,663 B2

FLEXOGRAPHIC PRINTING IMAGING WITH LEAD AND TRAIL EDGE STRIPS

CROSS-REFERENCE TO RELATED APPLICATIONS

This application claims the benefit of South African Provisional Patent Application No. 2021/02311 filed on Apr. 8, 2021, and claims the benefit of South African Provisional Patent Application No. 2021/06173 filed on Aug. 26, 2021, the contents of which are incorporated herein by reference in their entirety.

FIELD OF THE INVENTION

This invention relates to flexographic printing. In particular, the invention relates to a method of imaging a printing plate in a manner to replicate the mounting method used in the plate production process to be the same as when mounted on a flexographic printer (50). Thus, the invention details a method of preparing a flexographic printing plate suitable for use in flexographic printing. The process eliminates analogue and manual interventions and limitations which limits the accuracy of the final print registration amongst multicolor printing on a flexographic printer (50).

BACKGROUND OF THE INVENTION

Flexography or flexographic printing is a direct printing process using a mirrored image to facilitate right reading printed images onto a substrate. Flexographic printing has evolved from a rudimentary technology using rubber printing plates producing poor quality prints, to a modern printing method employing one or more processed flexible relief printing plates, allowing full-color picture printing on a wide variety of substrates and of a high quality that can rival the lithographic printing process.

Flexography or flexographic printing employs a processed flexible relief printing plate laminated to a flexographic printing plate that is wrapped around a printing cylinder of a printing press. Each flexographic printing plate prints a single color, so that where an image to be printed comprises more than one color, more than one flexographic printing plate is required, with the different flexographic printing plate each mounted on its own printing cylinder having to be mounted precisely so that the image transferred from each flexographic printing plate registers exactly with the images transferred in different colors from the other flexographic printing plates.

Flexographic printing plates begin as unprocessed flexible photopolymer plates that once processed and cured are transformed into processed flexible relief printing plates comprising an image thereon and are used to transfer ink and images to a substrate, such as paper or film. Generally, flexographic printing plates comprise a dimensionally stable backing sheet to which one or more unprocessed flexographic printing plates or processed flexible relief printing plate have been attached, with the image disposed of on the processed flexible relief printing plates.

Typically, in modern flexographic printing the flexographic printing plate is clamped or taped along one edge thereof of the dimensionally stable backing sheet, either at a lead edge, both side edges or a trail edge, or a combination thereof, to a flexographic imaging machine cylinder of an imaging machine or imagesetter or plate maker, such as a computer-to-plate (CTP) imaging machine. The flexographic printing plate is thus wrapped around the flexographic imaging machine cylinder, and then attached to the flexographic imaging machine cylinder along other edges, e.g., using a clamp or adhesive tape for a trail edge, and adhesive tape for side edges.

The one or more flexographic printing plates are then imaged in conventional fashion, e.g., using a laser imaging process on a digital flexographic printing plate before the edges of the dimensionally stable backing sheet are released from the flexographic imaging machine cylinder of the imaging machine. The imaged flexographic printing plate is then processed, e.g., in a water or solvent washing out machine, to remove uncured photopolymer, thereby to provide the relief image(s) on the one or more flexographic printing plates and typically dried. It is then applied to a printing cylinder, which requires the addition of a lead and/or trail edge to be applied, to allow for secure attachment to the printing cylinder. Once attached to the printing cylinder, it can be inked for application to a substrate. However, such generic process requires numerous manual alignment steps, each of which cannot reasonably be in appropriate alignment. This leads to lower quality or resolution printing and striping and other color issues that plague this type of printing.

Applicant has created a new method of manufacture and method of printing that generates a superior processed flexible relief printing plate and a method of imaging and printing for use in flexographic printing that generates superior image quality and uses less ink than prior art methodologies.

SUMMARY OF THE INVENTION

The methods and processes herein detail an improved flexographic printing process, which allows for superior registration between colors in flexographic printing that rivals the accuracy of digital printing. In order to achieve this, manual and analogue processes and procedures must be eliminated from the plate manufacturing process. This will result in a final product whereby tighter print tolerances can be achieved. This aim is achieved by using a new flexographic imaging machine (90) comprising an imaging cylinder (45) having a machine mounting formation (30), that matches the machine mounting formation (30) on the printing cylinder to be utilized. This imaging cylinder (45) comprises at least the same dimensions as the printing cylinder (56) so that the same machine mounting formation (30) can be used on each. Furthermore, by ensuring that the mounting process when imaging is taking place is identical to the mounting process that will be used on the flexographic printing press (50) a dramatic improvement in the registration and quality of print is obtained.

Accordingly, the above generates improvements to the printing process that includes: a reduction in trapping, the elimination of use of manual and analogue technologies in the plate manufacturing process, generation of an improved image quality, reduction in waste products in producing plates, and other improvements which will be obvious to one of ordinary skill in the art. In sum, by imaging the plate in the same manner as the plate will be attached to a printing cylinder for printing, substantial improvements in space management are also generated.

In a preferred embodiment, a method for flexographic printing comprising: attaching a portion of photopolymer to a dimensionally stable backing sheet; attaching a lead edge strip and a trail edge strip to said dimensionally stable backing sheet to form a flexographic printing plate; securing the flexographic printing plate comprising a portion of photopolymer to an imaging cylinder by securing the lead edge strip to a lead edge lock formation and securing said trail edge strip to a trail edge lock formation; imparting an image to said portion of photopolymer; washing said photopolymer to remove unreacted photopolymer and drying said photopolymer to form a processed flexographic printing plate; attaching said processed flexographic printing plate to a printing cylinder, wherein said lead edge strip is secured to a lead edge lock formation and said trail edge strip is secured to a trail edge lock formation that replicates the attachment from the imaging cylinder; and printing an image onto a substrate by pressing said processed flexographic printing plate to said substrate with an ink.

In a further embodiment, the method wherein the washing and drying step further comprises a detacking step.

In a further embodiment, the method wherein the lead edge strip comprises a lead edge prong, said lead edge prong engaging with a lead edge lock formation on each of the imaging cylinder and the printing cylinder.

In a further embodiment, the method wherein the trail edge strip comprises a plurality of apertures, wherein mounting said trail edge strip to said trail edge lock formation comprises securing into at least one aperture a trail aperture prong, and attached to said trail aperture prong is a tensioning band, wherein said tensioning band is further secured to a trail hook comprising a trail edge prong, and wherein said trail edge prong is secured to said trail edge lock formation.

In a further embodiment, the method wherein the portion of photopolymer is a flexographic printing plate, wherein before imaging, said flexographic printing plate comprises a laser ablation layer, a sheet photopolymer layer, and a compressible layer, and wherein said compressible layer is secured to said dimensionally stable backing sheet.

In a further embodiment, the method wherein the lead edge lock formation and trail edge lock formation are formed on a mounting bar positioned within a longitudinal slot in said imaging cylinder or said printing cylinder.

In a further embodiment, the method further comprising at least two flexographic printing plates disposed on said dimensionally stable backing sheet.

In a further embodiment, the method wherein the portion of photopolymer comprises a top side and a bottom side and wherein the bottom side is UV cured before being attached to a compressible layer and the compressible layer is attached to the dimensionally stable backing sheet.

In a further embodiment, the method wherein the lead edge lock formation and trail edge lock formation on each of the imaging cylinder and the printing cylinder are equivalent.

In a further embodiment, the method wherein the equivalent lead edge lock formation and trail edge lock formation allow for a reproduction of the position and tension of the flexographic printing plate on each of the imaging cylinder and the printing cylinder.

In a further embodiment, the method wherein imparting said image to said portion of photopolymer is performed by laser ablating an image into a laser ablation layer and UV curing the photopolymer, wherein the portion that was ablated by the laser is cured by the UV curing.

In a further preferred embodiment, a method of forming a digital image on a flexographic printing plate comprising: attaching a portion of photopolymer to a dimensionally stable backing sheet; attaching a lead edge strip and a trail edge strip to said dimensionally stable backing sheet to form a flexographic printing plate; securing the flexographic printing plate comprising a portion of photopolymer to an imaging cylinder by securing the lead edge strip to a lead edge lock formation and securing said trail edge strip to a trail edge lock formation; imparting an image to said portion of photopolymer; and washing said photopolymer to remove unreacted photopolymer and drying said photopolymer to form a processed flexographic printing plate.

In a further embodiment, the method wherein the washing and drying step further comprises a detacking step.

In a further embodiment, the method wherein the lead edge strip comprises a lead edge prong, said lead edge prong engaging with a lead edge lock formation on the imaging cylinder.

In a further embodiment, the method wherein the trail edge strip comprises a plurality of apertures, wherein mounting said trail edge strip to said trail edge lock formation comprises securing into at least one aperture a trail aperture prong and attached to said trail aperture prong is a tensioning band, wherein said tensioning band is further secured to a trail hook comprising a trail edge prong, and wherein said trail edge prong is secured to said trail edge lock formation.

In a further embodiment, the method wherein the portion of photopolymer is a flexographic printing plate, wherein before imaging, said flexographic printing plate comprises a laser ablation layer, a sheet photopolymer layer, and a compressible layer, and wherein said compressible layer is secured to said dimensionally stable backing sheet.

In a further embodiment, the method wherein the portion of photopolymer comprises a top side and a bottom side and wherein the bottom side is UV cured before being attached to a compressible layer and the compressible layer is attached to the dimensionally stable backing sheet.

In a further embodiment, the method further comprising at least two flexographic printing plates disposed on said dimensionally stable backing sheet.

In a further embodiment, the method wherein imparting said image to said portion of photopolymer is performed by laser ablating an image into a laser ablation layer and UV curing the photopolymer, wherein the portion that was ablated by the laser is cured by the UV curing.

In a further preferred embodiment, an imaging machine for imparting a digital image onto a flexographic plate comprising an imaging cylinder and an imaging laser; said imaging cylinder comprising a longitudinal slot substantially disposed along the length of the imaging cylinder; said longitudinal slot comprising therewithin a mounting formation comprising a lead edge lock formation and a trail edge lock formation; wherein the imaging machine is sized such that the imaging cylinder is of sufficient length to image a flexible relief printing plate having attached thereto a lead edge strip and a trail edge strip.

In a further preferred embodiment, a flexographic printing plate comprising: a sheet photopolymer layer and a compressible layer attached or bonded to the sheet photopolymer layer, with a pliable adhesive layer and without an intervening second dimensionally stable slug backing material, wherein the sheet photopolymer layer has a top side for receiving an image and a bottom side which is precured to be secured to said compressible layer.

In a further preferred embodiment, the methods and devices described herein can be used with certain interchangeable parts, wherein the method and device provide for imaging a flexographic relief printing plate by attaching it to an imaging cylinder for digital application of an image, and wherein upon removal and processing of said image, the flexographic relief printing plate, now imaged, is secured to a printing cylinder, wherein the position and tension of the flexographic relief printing plate are replicable between the imaging cylinder and the printing cylinder.

BRIEF DESCRIPTION OF THE FIGURES

The invention will now be described, by way of example only, with reference to the accompanying diagrammatic drawings, in which some of the elements are not drawn to scale, and certain features have been exaggerated for purposes of clarity.

FIG. 1A shows a vertical lead edge to trail edge section through one embodiment of a corrugated flexographic printing plate in accordance with the invention and FIG. 1B provides a detail of a section through a flexographic printing plate, and FIG. 1C depicts a trail edge formation.

FIG. 2 shows a vertical lead edge to trail edge section through another embodiment of a rigid corrugated flexographic printing plate in accordance with the invention.

FIG. 5A shows a vertical lead edge to trail edge section through one embodiment of a corrugated flexible relief printing plate prepared in accordance with the method of the invention, and FIG. 5B depicts the lead edge to trail edge in a rigid corrugated flexible relief printing plate.

DETAILED DESCRIPTION OF THE INVENTION

Figure 3B:
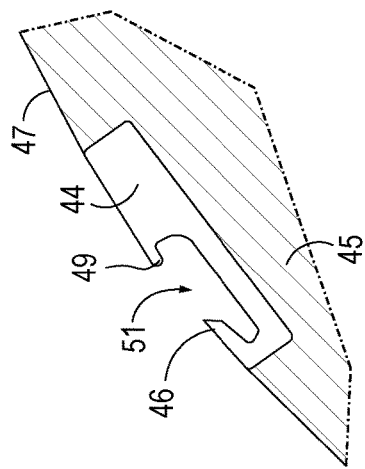
FIG. 3A shows a portion of a flexographic imaging machine cylinder of a flexographic imaging machine, together with FIG. 3B, which depicts an enlarged view of a portion of a transverse section through the flexographic imaging machine cylinder.

As used herein, the following terms have the following definitions:

ANALOGUE FLEXOGRAPHIC PRINTING PLATES: A flexographic printing plate (10) that is produced by separately imaging the matt film/negative and then applying it to the surface of the sheet photopolymer layer (16) of an analog plate, covered with a vacuum sheet, and, with vacuum applied, exposed to the UV light. The final dots and lines on the plate are enlarged to some extent compared to dots and lines on the film, due to the deflection and refraction of light passing through the cover sheet, the imaged film, and the plate slipcover that stops the film sticking to the photopolymer.

BACKING ADHESIVE LAYER (22): Any layer of substance, such as double-sided tape used for attaching the flexographic printing plate (10) or a rigid flexographic printing plate (42) to the dimensionally stable backing sheet (28) or attached to the dimensionally stable backing sheet (28) to the printing cylinder (56).

COMPUTER TO PLATE MACHINE (CTP): An imaging technology which helps to transfer a digital image generated in a computer directly to a printing plate, without the use of film.

COMPRESSIBLE LAYER (20): A compressible material located between the pliable adhesive layer (18) and the backing adhesive layer (22), preferably an open cell, closed cell, or semi-closed cell foam, and most preferably a closed cell foam such as PE foam or polyurethane foam. The compressible substrate comprises a low latency rate, meaning, that it rapidly returns to its original shape. In the industry, the compressible layer may also be referred to as a compressible substrate layer or cushioning foam.

CONTINUOUS FOAM LAYER (48): A compressible material located between the dimensionally stable backing sheet (28) and either the imaging cylinder (45) or the printing cylinder (56), preferably an open cell, closed cell, or semi-closed cell foam, and most preferably a closed cell foam such as PE foam or polyurethane foam. The compressible substrate comprises a low latency rate, meaning, that it rapidly returns to its original shape. In the industry, the continuous foam layer may also be referred to as a compressible substrate layer or cushioning foam.

CORRUGATED FLEXOGRAPHIC PRINTING PLATE (34): A plate comprising one or more flexographic printing plates (10) attached to a dimensionally stable backing sheet (28) with an optional lead edge strip (15), optional trail edge strip (17) and optional spaced apertures (84) which is attached to an imaging cylinder (45) for imaging to yield one or more processed flexible relief printing plates (27), and thereafter attached to a printing cylinder (56) for printing.

DIGITAL FLEXOGRAPHIC PRINTING PLATES: A flexographic printing plate (10) that is produced without the use a film/negative, but instead, a laser ablation layer (14), commonly referred to as the black layer, is applied to the surface of the sheet photopolymer layer (16). The laser ablation layer (14) is then ablated using a high-powered laser imaging device, removing the laser ablation layer (14) where image areas are required, and leaving the rest to be the mask for the nonimage areas. The flexographic printing plate (10) is then exposed in a normal exposure unit, but without the vacuum, meaning it is exposed in the presence of air. The oxygen in the air reacts with the photo initiators, slowing the polymerization process, resulting in shrinkage of the dots and instead of flat tops, they are bullet shaped dots.

DIMENSIONALLY STABLE BACKING SHEET (28): A stable and flexible sheet, preferably with a thickness of between 0.1 mm and 0.5 mm, and most preferably about 0.25 mm. Typically, this is made of biaxially oriented polyethylene terephthalate (mylar) or PVC. In the industry, the dimensionally stable backing sheet may also be referred to as a dimensionally stable carrier sheet or layer.

DIMENSIONALLY STABLE SLUG BACKING MATERIAL (23): A second stable backing sheet, typically made from biaxially-oriented polyethylene terephthalate or PVC that is contained in a conventional flexographic printing plate know in the prior art, which is part of a rigid flexographic printing plate (42).

IMAGING CYLINDER (45): A cylinder used in a computer to plate machine, also known as a CTP machine, to which a corrugated flexographic printing plate (34) with an unimaged flexographic printing plate (10) or slug is attached, or to which a rigid corrugated flexographic printing plate (40) with an unimaged rigid flexographic printing plate (42) is attached, which comprises a mounting element such as the mounting bar (44) or other mounting element as defined by the particular machine mounting formation.

FLEXOGRAPHIC PRINTING: Form of rotary printing in which ink is applied to various surfaces by means of flexible rubber (or other elastomeric) printing plates. In the industry, flexographic printing may also be referred to as flexography.

FLEXOGRAPHIC PRINTER (50): A printing machine used for flexographic printing.

FLEXOGRAPHIC PRINTING PLATE (10): An unprocessed flexible natural rubber or photopolymer plate, used in flexographic printing which is imaged using a CTP Machine. As shown in FIGS. 1A and 1B, the flexographic printing plate is composed of the layers: (i) removable protective polyester cover film (12), (ii) laser ablation layer (14), (iii) a sheet photopolymer layer (16) which can be uncured or precured, (iv) a pliable adhesive layer (18), (v) a compressible layer (20), and (vi) a backing adhesive layer (22). Before being secured to a backing sheet, a removable HDPE liner (not depicted) protects the backing adhesive layer (22). While a flexographic printing plate can be an analogue flexographic printing plate or a digital flexographic printing plate, the methods herein utilized a digital flexographic printing plate. A flexographic printing plate can be cut into a slug and attached to dimensionally stable backing sheet (28) to create a corrugated flexographic printing plate (34), wherein such slugs can be positioned where an image will be defined, thus reducing the amount of flexographic material needed for imaging. In the industry, a flexographic printing plate may also be known as a photopolymer plate, a photopolymer printing plate, or a flexible photopolymer plate. Once the flexographic printing plate is imaged and processed it becomes a processed flexible relief printing plate (27) and is used to transfer ink and images to a substrate (60), such as paper or film with the surface of the processed flexible relief printing plate (27) being the only area that comes into contact with the substrate (60) after the ink is applied to the plate.

HDPE LINER: A removable layer of material that protects the backing adhesive layer (22) until the backing adhesive layer (22) is intended to be attached to another surface such as the dimensionally stable backing sheet (28).

LASER ABLATION LAYER (LAMS) (14): A layer in the flexographic printing plate (10) or a rigid flexographic printing plate (42). Upon preexposure, LAMS layer has to be removed by laser ablation only at the surfaces where photopolymer plate needs to be exposed. After ablation, the exposures to UV lights follows and the plate will be finished with chemical removal of the unexposed parts of the polymer.

MACHINE MOUNTING FORMATIONS (30): A lead edge and trail edge anchor formation and a lead edge lock formation or lead edge mounting system disposed of on a cylinder (also referred to as lockup device or lockup system). Several such conventional lead edge mounting systems are known and in use on flexographic printers, e.g., the Matthews Fast-Lok® system from Matthews International Corporation, Dicar's Fast-Lok main bar mount system, the Inland-Annen system, the Bobst Group full wrap system, the PlateLoc™ mounting attachment system of Container Graphics Corporation and the Plate Lock-Up System (PLUS™ System) of Corrugated Gear and Services Inc. One specific example is the Matthews Fast-Lok® lead edge strip (commonly referred to as a J-bar), securely attached to a lead edge of the dimensionally stable backing layer. In the embodiments herein, the type of machine mounting formation (30) may be interchangeable, so long as the same machine mounting formation (30) is used for both the imaging cylinder (45) and the printing cylinder (56).

PLIABLE ADHESIVE LAYER (18): Any layer of substance used for laminating the sheet photopolymer layer (16) to the compressible layer (20) in the flexographic printing plate (10) such as hot melted or UV cured adhesive.

PRINTING CYLINDER (56): Typically an aluminum or steel alloy, cylindrical form used in a flexographic printer (50) which carries the corrugated flexographic printing plate (34) or the rigid corrugated flexographic printing plate (40), which is responsible for the transfer of the image to the substrate (60). Common types of cylinders include (i) integral plate cylinder where every part of the cylinder, including shafts, body, and end caps, are contained in a single unit and (ii) a demountable plate cylinder which is manufactured without preattached shafts, this type of plate cylinder can be mounted onto an existing shaft. In the industry, the printing cylinder may also be referred to as a print cylinder, printing press cylinder, plate cylinder or print sleeve, sleeve, or drum.

PROCESSED FLEXIBLE RELIEF PRINTING PLATE (27): An imaged, processed (washed out, dried) and cured flexographic printing plate (10) or slug.

PROTECTIVE POLYESTER COVER FILM (12): Any removable protective material that is attached to the laser ablation layer (14) to protect any of the laser ablation layer (14) from being removed from the sheet polymer layer (16) until the flexographic printing plate (10) or a rigid flexographic printing plate (42) is ready for imaging and processing.

RELIEF IMAGE: A processed plate image in which the unhardened polymer is removed from the nonimage areas, leaving the relief image areas. These areas will not be printed.

RIGID CORRUGATED FLEXOGRAPHIC PRINTING PLATE (40): Rigid flexographic printing plate (42) after being exposed, washed out and cured to create a rigid processed relief printing plate (29). This plate is typically attached to dimensionally stable backing sheet (28) and supported by the continuous foam layer (48).

RIGID FLEXOGRAPHIC PRINTING PLATE (42): An unimaged photopolymer plate, typically unexposed with protective polyester cover film (12) still intact but omitting a compressible layer (20).

SLUG: A portion cut from the flexographic printing plate (10) or a rigid flexographic printing plate (42) that includes all layers of the flexographic printing plate (10) or a rigid flexographic printing plate (42). In the industry, this might also be referred to as a portion.

SUBSTRATE (60): The base material that the image will be printed on such as corrugated cardboard, a plastic film, glass, paper, other textile product, foil, metal, cloth, or any other surface to which printing ink will be applied.

SHEET PHOTOPOLYMER LAYER (16): A photosensitive material or polymer in sheet form that is part of the flexographic printing plate (10) or a rigid flexographic printing plate (42) with one or multiple side(s) that are light sensitive and is exposed to UV lights through a negative film or laser ablation layer (14). The light shines through the clear sections of the film or the removed laser ablation layer (14) and hardens the polymer. The plate is washed out with water or another washing fluid and the exposed areas are left to form the relief and the unexposed areas are washed away. The plate is dried and exposed to UV one more time to complete the process. The plate image and text will be inversed so when mounted onto the base system in the press, it will be inked and print right-reading onto the paper. Upon imaging, it becomes a processed sheet photopolymer layer (19).

An improved process for flexographic printing is needed to continue competition with digital printing. Digital printing will be the future competitor of flexographic printing because of the advantages of precise images from digital printing. However, digital printing is substantially more expensive per unit and runs at a fraction of the print speed of flexographic printing. To further extend the life of the flexographic industry, registration between colors in flexographic printing must rival the accuracy of digital printing.

Existing flexographic printing is limited for several reasons:

LIMITATION 1: The lead edge strip (15) and trail edge strip (17) are post mounted after the CTP imaging process.

LIMITATION 2: Post mounting of relieved processed photopolymer printing plates (19 or 27) using camera technology is a manual process.

LIMITATION 3: Tape used to attach the relieved processed photopolymer printing plates (19 or 27) to the dimensionally stable carrier sheet (28) is extremely tacky. Mounting slugs accurately with this tacky adhesive tape limits the positioning accuracy.

LIMITATION 4: The use of negatives is analogue technology reducing quality and accuracy of the final print image.

LIMITATION 5: The current camera technology is done predominantly in the flat rather than in the round, which provides the image in a planar form instead of the rounded form when in use on a printing cylinder, this causes distortions from bigger/solid plates versus mounting slugs.

The above five limitations must be eliminated as to obtain the advantages of the conventional computer to plate imaging machine. This elimination will improve digital accuracy, improve the quality of multicolor print registration, reduce trapping and enhance the flexographic printing process longevity against the digital printing threat. All five limitations as previously listed are eliminated by the use of the new flexographic imaging machine cylinder (90).

In order to improve the analog processes outlined above, all manual and analogue processes and procedures must be eliminated or reduced from the plate manufacturing process. This will result in a final product whereby tighter print tolerances can be achieved. This aim can be achieved by using a new flexographic imaging machine (90) comprising an imaging cylinder (45) utilizing an analogous machine mounting formation (30) as the printing cylinder (56) to be used in a given printing, and which is defined by the methods detailed herein. This imaging cylinder enables the plate manufacturer to produce a flexographic plate that caters for the dimensions of the printing cylinder that is used on the flexographic printing press (50) allowing for the same mounting elements and tension on the plate when imaging that will be used on the flexographic printing press (50). This ensures accuracy of the plate from imaging to printing and can be replicated among several plates for different color application for a given image.

Thus, the embodiments herein refer to a new and useful corrugated flexographic printing plate, a method of manufacture of the same, and most particularly towards a method of use for printing on a substrate in superior multicolor print registration. Notably, the embodiments herein provide a significant advantage over the prior art leading to a substantial reduction in print production downtimes and a plate that provides a superior printing tolerance. Furthermore, this can yield a single imaging machine that, after processing the image, can be simply attached onto a printing cylinder (56) instead of the numerous post processing and alignment steps of the prior art.

As will be appreciated by those of ordinary skill in the art, a requirement for printing is an attachment mechanism from the printing plate to a printing machine. Existing technologies utilize post mounting of lead edge strips (15) or other lead edge mounting elements to corrugated flexographic printing plates (34) or rigid corrugated flexographic printing plates (40) after the flexographic printing plate (10) or the rigid flexographic printing plate (42) has been imaged and processed into a processed flexible relief printing plate (27). Such post processing operations create an opportunity for misalignment and require trained personnel and numerous computer guided and imaging elements to generate rudimentary alignment. However, the misalignment occurs as the subsequently applied or post processing applied lead edge strip (15) is mounted such that it is not perfectly parallel to a line along which the corrugated flexographic printing plate (34) was clamped to the flexographic imaging machine cylinder (45) of the imaging machine. This error is then potentially multiplied because when more than one color is to be applied (each by a different processed flexible relief printing plate [27]) during the flexographic printing process, the misalignment causes striping and lack of detail due to imperfect alignment. Thus, the misalignment causes major problems and lack of image quality and printing production downtime.

The method herein details a process in which a flexographic printing plate is created with a lead edge strip (15) positioned before imaging (premounting), thus ensuring that consistency is maintained and misalignment errors from post processing the lead edge strip (15) mounting is eliminated. Furthermore, preferably, the trail edge of the flexographic printing plate and tensioning of the flexographic printing plate are therefore utilized in the same manner. When both the imaging cylinder (45) and the printing cylinder (56) utilize the same machine mounting formation (30), the lead edge strip (15) and trail edge strip (17) allow for a similar tension in both the imaging step and in the printing step as well as a precise positioning that will eliminate misalignment.

FIGS. 1 and 2 refer to various embodiments related to creation of an unimaged plate, namely a corrugated flexographic printing plate (34) in FIGS. 1A and 1B and a rigid corrugated flexographic printing place (40) in FIG. 2. Each of these variations, as well as others known to those of ordinary skill in the art can be utilized in the present embodiments to mount the printing plate onto the imaging cylinder and then mounting the same printing plate to the printing cylinder as detailed herein. FIG. 1C further details elements of a trail edge strip (17) and attachment mechanisms used in a machine mounting formation (30).

FIG. 1A defines one embodiment of a corrugated flexographic printing plate (34) in accordance with the disclosure. The corrugated flexographic printing plate (34) is an unimaged flexographic plate, but which is prepared so as to receive an image and maintain alignment in superior fashion as compared to the prior art. The corrugated flexographic printing plate (34) thus comprises a dimensionally stable backing sheet (28) with a lead edge strip (15) and a trail edge strip (17) adhesively attached or stitched or ultrasonically welded respectively to the dimensionally stable backing sheet (28) before imaging.

In the embodiment shown in FIG. 1A, the corrugated flexographic printing plate (34) carries two flexographic printing plates (10). Each flexographic printing plate (10) is attached to a major face of the dimensionally stable backing sheet (28) by means of a backing adhesive layer (22). Above the backing adhesive layer (22) is a compressible layer (20), which is separated by a pliable adhesive layer (18) from a sheet photopolymer layer (16). On top of the sheet photopolymer layer (16) there is provided a laser ablation layer (14), which is covered by an optional protective polyester cover film (12) which is removable or peelable. The sheet photopolymer layer (16) is unprocessed and planar (i.e., not processed or treated to define any raised, relief image) in this phase and is defined to receive an image thereon.

The laser ablation layer (14) is a conventional laser ablation layer (LAMS layer) adhesively laminated or bonded to the sheet photopolymer layer (16) (the laminating adhesive layer is very thin and is not shown in the drawing) and thus is not transparent to UV light.

In the embodiment shown in FIG. 1A, the protective polyester cover film (12) has a thickness of about 100 μm, the laser ablation layer (14) has a thickness of about 5 μm, the sheet photopolymer layer (16) has a thickness of about 3.18 mm, the pliable adhesive layer (18) has a thickness of about 0.1 mm, the compressible layer (20) has a thickness of about 3.8 mm, and the backing adhesive layer (22) has a thickness of about 0.1 mm. Preferably, the dimensionally stable backing sheet (28) is a biaxially-oriented polyethylene terephthalate sheet with a thickness of about 0.25 mm. However, those of ordinary skill will recognize that these dimensions can be modified based upon readily available materials and specific printing machine requirements, which may have different dimensions.

In the embodiment shown in FIGS. 1A and 1B, the compressible layer (20) is a closed-cell polyethylene foam layer. In each case, the compressible layer (20) is a material that allows for rapid return to its original shape, thus its latency is important. This is particularly relevant based on the speed of the printing. If the material has a lower latency, then the printing speed must be modified as well, so that the compressible layer (20) has fully returned to its original shape.

The sheet photopolymer layer (16) is of a conventional sheet photopolymer or resin material suitable for use as a sheet photopolymer system on a flexographic printing plate, such as a mixture of monomeric styrene and oligomer acrylates. As is conventional, the photopolymer or resin of the sheet photopolymer layer (16) is configured, after selective UV light exposure, to form an image of cured photopolymer, with uncured photopolymer, i.e., photopolymer not exposed to UV light, being removable by water washing, solvent washing, or heat treatment.

Figure 4B:
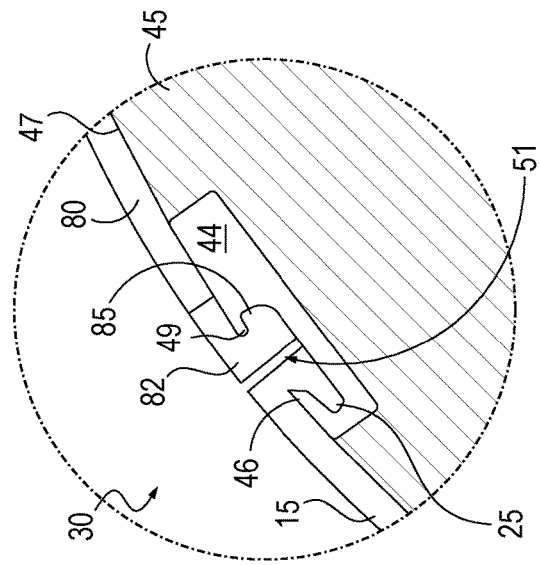
FIG. 4B depicts an enlarged view of the attachment of the components of the machine mounting formations (30) to secure the printing plate to the imaging cylinder.
Figure 4A:
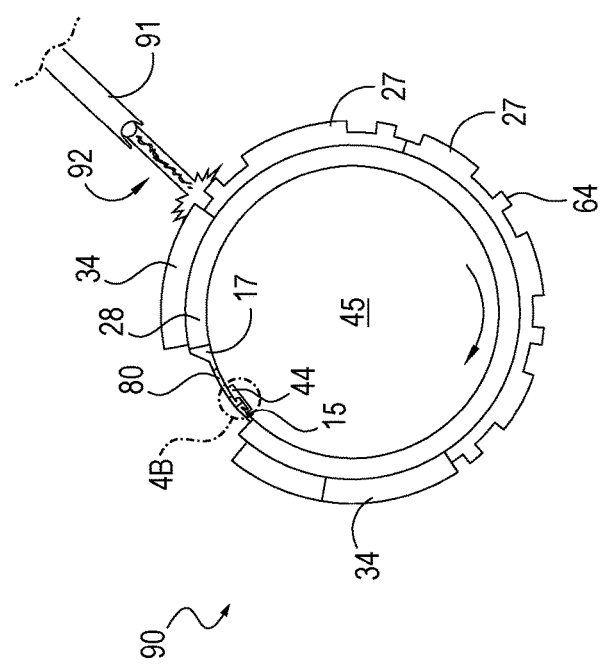
FIG. 4A depicts a flexographic imaging machine, with a flexographic printing plate attached to a cylinder on said machine.

As detailed in FIG. 1B, in the flexible printing plate, the sheet photopolymer layer (16) has a top side (16.1) remote from the compressible layer (20) that is uncured, allowing the sheet photopolymer layer (16) to be processed to provide a negative or mirror relief image of cured photopolymer for flexographic printing purposes as depicted by the imaging machine of FIG. 4A. In contrast, the bottom side (16.2) of the sheet photopolymer layer (16) adjacent the compressible layer (20) is precured with UV light (typically UV-A light), prior to the compressible layer (20) being adhesively attached to the sheet photopolymer layer (16) by means of the pliable adhesive layer (18). The UV light penetrates through a portion of the sheet photopolymer layer (16) but not all the way through, allowing the top side (16.1) to remain uncured. Thus, once an image is applied and cured to the top side (16.1), the top side (16.1) can be washed and a portion of the sheet photopolymer layer (16) is removed. However, because of the precuring on the bottom side (16.2), a portion of the bottom side remains, thereby allowing for the sheet photopolymer layer (16) to be adhered to the compressible layer (20).

A feature of the embodiments of the invention is that the imaging of the corrugated flexographic printing plate (34) is performed on a CTP machine when the corrugated flexographic printing plate (34) is mounted to the imaging cylinder (45). Furthermore, the mounting on the imaging cylinder (45) in the same manner as the mounting on the printing cylinder (56). In order to do this, each of the imaging cylinder (45) and the printing cylinder (56) must utilize the same mounting bar (44) as part of the same machine mounting formation (30). The machine mounting formation (30) (FIG. 4B) collectively refers to the combination of the lead edge strip (15) the trail edge strip (17) and the mounting bar (44) as well as the elements used to secure the lead edge strip (15) and the trail edge strip (17) to the mounting bar (44). The lead edge strip (15) uses the lead edge prong (25) with the lead edge recess (21) to engage to the lead edge lock formation (46) on a cylinder. Together, FIG. 1A and FIG. 1C depict how the trail edge strip (17) combined with spaced apertures (84) engage to a trail aperture prong (81), which is secured to a tensioning band (80). The tensioning band (80) is then attached to a trail edge hook (82), which comprises a trail recess (83) and a trail edge prong (85). Specifically, the trail recess (83) and the trail edge prong (85) engage into recess (51) as depicted in FIGS. 3B and 4B.

As depicted, the lead edge strip (15) is a conventional lead edge anchor formation, in the form of a J-bar, forming part of a conventional flexible relief printing plate lead edge mounting system. The trail edge strip (17) is a conventional trail edge anchoring formation forming part of a conventional flexible relief printing plate trail edge mounting system. Preferably, the lead edge strip (15) and the trail edge strip (17) are made of synthetic plastics or polymeric materials, though other suitable materials are known in the art. When securing the flexographic plate to an imaging cylinder (45) or a printing cylinder (56) as part of a machine mounting formation (30) system, both the lead and trail edge are secured so as to allow repeatability of the position and tension of the flexographic plate for both the imaging and printing steps. Therefore, the lead edge strip (15) is secured in the same manner on each of the imaging cylinder (45) and the printing cylinder (56). Similarly, the trail edge of the wrapped corrugated flexographic printing plate (34) (i.e., a trail edge of the dimensionally stable backing sheet (28)) is attached to the imaging cylinder (45) and the printing cylinder (56), e.g., using a trail edge strip (17) (e.g., in a full wrap arrangement) or other trail edge anchoring or fastening formations or element(s), e.g., tensioning bands (80) (a stretchable band, such as rubber or elastic, or other suitable material) forming part of a trail edge mounting system.

Those of ordinary skill in the art will recognize that the particular engagement system between the lead edge and the cylinder and the trail edge and the cylinder is one of a variety of attachment systems, with the embodiments herein defining that both the imaging cylinder and the printing cylinder possess the same mounting bar (44) feature to allow for consistent attachment for both the imaging and the printing steps.

Thus, the lead edge strip (15) and the lead edge lock formation (46) may be conventional components of a conventional lead edge mounting system (also referred to as lockup device or lockup system). Several such conventional lead edge mounting systems are known and in use on flexographic printers, e.g., the Matthews Fast-Lok® system from Matthews International Corporation, Dicar's Fast-Lok main bar mount system, the Inland-Annen system, the Bobst Group full wrap system, the PlateLoc™ mounting attachment system of Container Graphics Corporation and the Plate Lock-Up System (PLUS™ System) of Corrugated Gear and Services Inc. (see, e.g., U.S. Pat. No. 9,895,859 B2). In one embodiment of the invention, the lead edge lock formation (46) is a Matthews Fast-Lok® lock formation, mounted in a longitudinal recess (51) in the flexographic imaging machine cylinder (45) of the flexographic imaging machine. The lead edge strip (15) is adhesively attached to a lead edge of the dimensionally stable backing sheet (28) and/or stitched by a sewing machine or ultrasonically welded.

Wrapping said corrugated flexographic printing plate (34) or rigid corrugated flexographic printing plate (40) may include locking a trail edge anchor formation positioned along a trail edge of the dimensionally stable backing sheet (28) to a trail edge lock formation (49) carried by or defined by the flexographic imaging machine cylinder (45) of the imaging machine. Instead, wrapping said corrugated flexographic printing plate (34) or rigid corrugated flexographic printing plate (40) may include clamping or taping or otherwise adhesively, removably, attaching a trail edge of the dimensionally stable backing sheet (28) to the flexographic imaging machine cylinder (45) of the imaging machine incorporating appropriate tensioning mechanisms.

For imaging, each printing plate comprises pieces or portions cut from a flexographic printing plate or a rigid flexographic printing plate (40) (from FIG. 2) that are often referred to as slugs for receiving an image. Notably, these flexographic printing plates (10) or the rigid corrugated flexographic printing plate of FIG. 2 are appropriately referred to as raw or unprocessed slugs. As used throughout, corrugated flexographic printing plate can refer to a full sheet or slug cut from a full sheet. However, each corrugated flexographic printing plate (34) may contain as few as one flexographic printing plate (10), or as numerous as is required for printing of the desired imagery. The differences between FIG. 1A and FIG. 2 relate specifically to the way in which the corrugated flexographic printing plate (34) and the rigid corrugated flexographic printing plate (40) are made, with the later primarily including a continuous foam layer (48) as well as an extra dimensionally stable backing material (23). However, the manner for attachment with the lead edge strip (15) and the trail edge strip (17) remains the same for imaging and printing purposes. Thus, in either case, the plates comprise a lead edge strip (15) and, a trail edge strip (17) incorporating equalized tensioning facilities to allow for repeatable placement and tensioning for both the imaging cylinder (45) and a printing cylinder (56).

Referring to FIG. 2, the rigid corrugated flexographic printing plate (40) has slugs cut from a conventional rigid flexographic printing plate (42). The rigid flexographic printing plate (42) thus does not include compressible layers such as the compressible layer (20) of the flexographic printing plate (10) shown in FIG. 1A. Instead, as shown in FIG. 2, a single large compressible substrate layer, in the form of a continuous foam layer (48) is adhesively attached to a major, bottom surface of the dimensionally stable backing sheet (28), remote from the rigid flexographic printing plate (42).

As shown in FIG. 2, often a conventional rigid flexographic printing plate (42) from which the slugs are cut has its own dimensionally stable slug backing material (23) carrying or supporting the sheet photopolymer layer (16), so that each slug from the rigid flexographic printing plate (42) includes a layer of a dimensionally stable slug backing material (23), e.g., a biaxially-oriented polyethylene terephthalate sheet, which is then adhesively attached to the dimensionally stable backing sheet (28), so that there are two layers (23 and 28) of a dimensionally stable backing sheet or material separating the sheet photopolymer layer (16) and the continuous foam layer (48).

The corrugated flexographic printing plate (34) or the rigid corrugated flexographic printing plate (40) now being created, are used in a wholly different manner than in the prior art. Because the lead edge strip (15) is already attached to the dimensionally stable backing sheet (28), the entire corrugated flexographic printing plate (34) is secured to a flexographic imaging cylinder (45) to be imaged. This allows for the precise positioning added during imaging to be replicated in the mounting in the printing press on the printing cylinder (56), because neither the lead edge strip (15), nor the trail edge strip (17) will be modified or altered or even require adjusting or visually adjusting before locking it into place, as occurs in the prior art. This allows for repeatable positioning and tensioning of the plates to both of the imaging cylinder (45) and the printing cylinder (56).

Figure 3A:
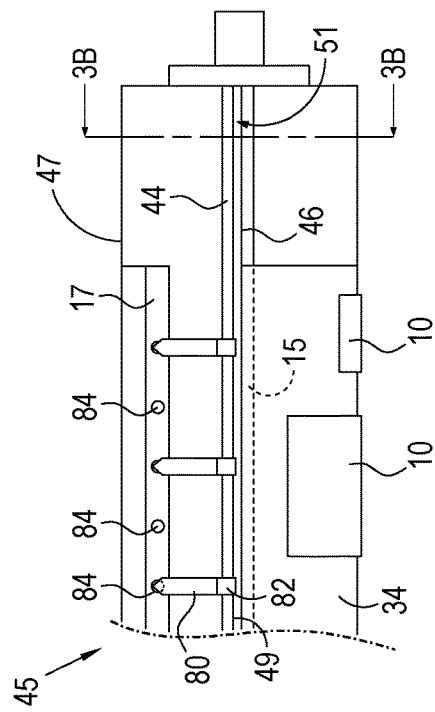

Thus, referring to FIG. 3A of the drawings, in accordance with the invention, a flexographic imaging machine cylinder (45) of a flexographic imaging machine defines a longitudinally extending recess (51) in a surface (47) of the flexographic imaging machine cylinder (45) a side profile of this detail is depicted in FIG. 3B. A metal mounting bar (44) forming part of a machine mounting formation (30) defines a lead edge lock formation (46) and a trail edge lock formation (49), which are configured to accept and receive elements to secure a flexographic plate to the imaging cylinder (45). The trail edge mounting system may form part of the lead edge mounting system, or instead the imaging cylinder (45) or printing cylinder (56) may define a trail edge locking formation (49), e.g., a longitudinal slot, which is circumferentially spaced from the locking formation or element of the lead edge mounting system.

In order to prepare the corrugated flexographic printing plate (34) or the rigid corrugated flexographic printing plate (40) for use in flexographic printing, i.e., to convert a flexographic printing plate (10) or slug into a processed flexible relief printing plate (27), or the processed equivalent of the rigid flexographic printing plate (42), the corrugated flexographic printing plate (34) or the rigid corrugated flexographic printing plate (40) is mounted to the flexographic imaging machine cylinder (45) before it is processed. For purposes of illustration, with reference to FIG. 3A, only the corrugated flexographic printing plate (34) as described in FIG. 1 is referred to hereinafter, but the process could also apply to the rigid corrugated flexographic printing plate (40) as described in FIG. 2 or another variant as known in the art.

The lead edge strip (15) (i.e., a J-bar lead edge anchor formation) of the corrugated flexographic printing plate (34) is hooked over or locked to the lead edge lock formation (46) as provided in the detail of FIGS. 3B and 4B, and the corrugated flexographic printing plate (34) is wrapped around the flexographic imaging machine cylinder (45). In order to secure the corrugated flexographic printing plate (34) to the imaging cylinder (45) and to create the proper tension, the trail edge of the dimensionally stable backing sheet (28) is attached to the trail edge lock formation (49). At the trail edge, apertures (84) are defined along the length of the trail edge (17), and a trail aperture prong (81) is positioned into the aperture (84). A tensioning band (80) then is connected to the trail edge hook (82). The trail edge hook (82) then comprises the trail recess (83) and the trail edge prong (85) which secure around the trail edge locking formation (49) which is part of the mounting bar (44). The tensioning mechanisms used must ensure that tension is applied evenly via the apertures across the trail edge. This can be accomplished by use of the tensioning band (80), in combination with the other features of the machine mounting formation (30).

As mentioned hereinbefore, the particular format of the trail edge strip (17) is optional to the extent that the flexographic printing plate can be replicably attached to the image cylinder (45) and to the printing cylinder (56). However, it is preferable to use the trail edge strip (17) with the tensioning bands (80) and the trail edge hook (82) to replicably secure and tension the flexographic printing plate to ensure precise mounting and tension. When the trail edge strip (17) or other trail edge mounting formation is absent, the trail edge of the dimensionally stable backing sheet (28) of the corrugated flexographic printing plate (34) is merely taped or clamped to the flexographic imaging machine cylinder (45) of the flexographic imaging machine, which may not replicate the tension over both the imaging step and the printing step.

Typically, side edges of the dimensionally stable backing sheet (28) are taped (not shown) to the flexographic imaging machine cylinder (45) (i.e., to the surface [47] of the flexographic imaging machine cylinder [45]). After the flexographic printing plate is secured to the imaging cylinder (45) the flexographic printing plate (10) of the corrugated flexographic printing plate (34) are imaged and processed in conventional fashion to provide a negative or mirror, relief image of cured sheet photopolymer layer (16) for flexographic printing purposes.

While FIG. 3A depicts a top view of an imaging cylinder (45), FIG. 4A depicts a side profile of the imaging cylinder (45). FIG. 4B then depicts the plate attached to the imaging cylinder, similar to FIG. 3B. Thus, as depicted in FIG. 4A, the corrugated flexographic printing plate (34) is attached to the imaging cylinder (45), by attaching the lead edge prong (25) around the lead edge lock formation (46), which is shown in detail in FIG. 4B. This secures the lead edge. Then, the corrugated flexographic printing plate (34) is wrapped around the imaging cylinder (45) and tensioned and secured into place with the trail edge elements, namely, the trail edge prong (85) is engaged under the trail edge locking formation (49). The tensioning bands (80) allow for the appropriate tension to be defined for the particular cylinder and plate, which are connected to the trail edge strip (17) through apertures (84) in the trail edge strip (17). Upon securing, the imaging and processing of the flexographic printing plate (10) comprises imaging of the flexographic printing plates (10) in the flexographic imaging machine (90).

The process of imaging a flexographic printing plate (10) or a rigid flexographic printing plate (42) of a flexible printing plate in a computer-to-plate (CTP) flexographic imaging machine, using laser exposure of the laser ablation layer (14) followed by UV exposure of resultant exposed areas of the sheet photopolymer layer (16), is well-known to those skilled in the art and will not be described in any detail. Similarly, processing of the flexographic printing plate (10) or the rigid flexographic printing plate (42) after UV light exposure to form a relief image of cured photopolymer, with uncured photopolymer being removed by water washing or solvent washing or heat treatment, is well-known to those skilled in the art and will not be described in any detail.

Briefly however, typically, for a digital flexographic printing plate (10) portion or slug, is back exposed, e.g., (16.2) from FIG. 1B, to crosslink the rear portion of the flexographic printing plate (10). Typically, this is done with UV light. To then impart the image to the top (16.1), the plate imaging process or slug imaging process comprises removal of the protective polyester cover film (12). The entire corrugated flexographic printing plate (34) is then mounted onto the imaging cylinder (45) and the following steps are performed: computer-to-plate laser imaging of the laser ablation layer (14), exposure of the laser ablation layer (14) and the sheet photopolymer layer (16) underneath the laser ablation layer (14) to UV light (typically UV-A light), removal of the laser ablation layer (14) and washing out or removal of uncured polymer from the sheet photopolymer layer (16) using a solvent or water, or a thermal process, drying of the cured sheet photopolymer layer (16) in a hot air drier. Further exposure of the cured sheet photopolymer layer (16) to UV light to complete photocuring, and exposure of the cured sheet photopolymer layer (16) to UV-C light to eliminate tackiness of the cured sheet photopolymer layer (16). FIG. 4A depicts, for example the laser head (91) and the laser beam (92) which impart the image onto the sheet photopolymer layer (16) by ablating with the laser beam (92).

After imaging and processing of the flexographic printing plate (10), one is left with one or more processed flexible relief printing plates (27) adhesively attached or laminated to a processed corrugated flexographic printing plate (74) as depicted by FIG. 5A, which already includes a lead edge strip (15) and a trail edge strip (17). This is then ready to be mounted into a printing cylinder (56) which can be used in a flexographic printer, such as the flexographic printer shown in FIG. 6 of the drawings. Notably, the imaging machine must be sized to allow for the entire corrugated flexographic printing plate (34) to be attached to the imaging cylinder (45) in the same fashion as it will be attached to the printing cylinder (56).

The imaged plates are thus depicted in FIGS. 5A and 5B detail such a processed flexible relief printing plate (27) or a rigid processed relief printing plate (29) and are positioned on a processed corrugated flexographic printing plate (74) or a processed rigid corrugated flexographic printing plate (140). Because an image has now been transferred, there is a processed sheet photopolymer layer (19) on each processed flexible relief printing plate (27 or 29) which was exposed and now defines a relief image, no longer having a planar upper surface. Furthermore, at least the protective polyester cover film (12) and the laser ablation layer (14) are also removed by the imaging steps. Thus yields a processed sheet photopolymer layer (19), which is attached to the pliable adhesive layer (18), which is attached to the compressible layer (20), which is in turn secured to the dimensionally stable backing sheet (28) via an adhesive layer (22) in FIG. 5A. FIG. 5B then follows the rigid materials from FIG. 2 to produce a similar processed sheet that defines an alternative sheet as detailed therein. The sheets are now ready to be utilized in printing.

Figure 6:
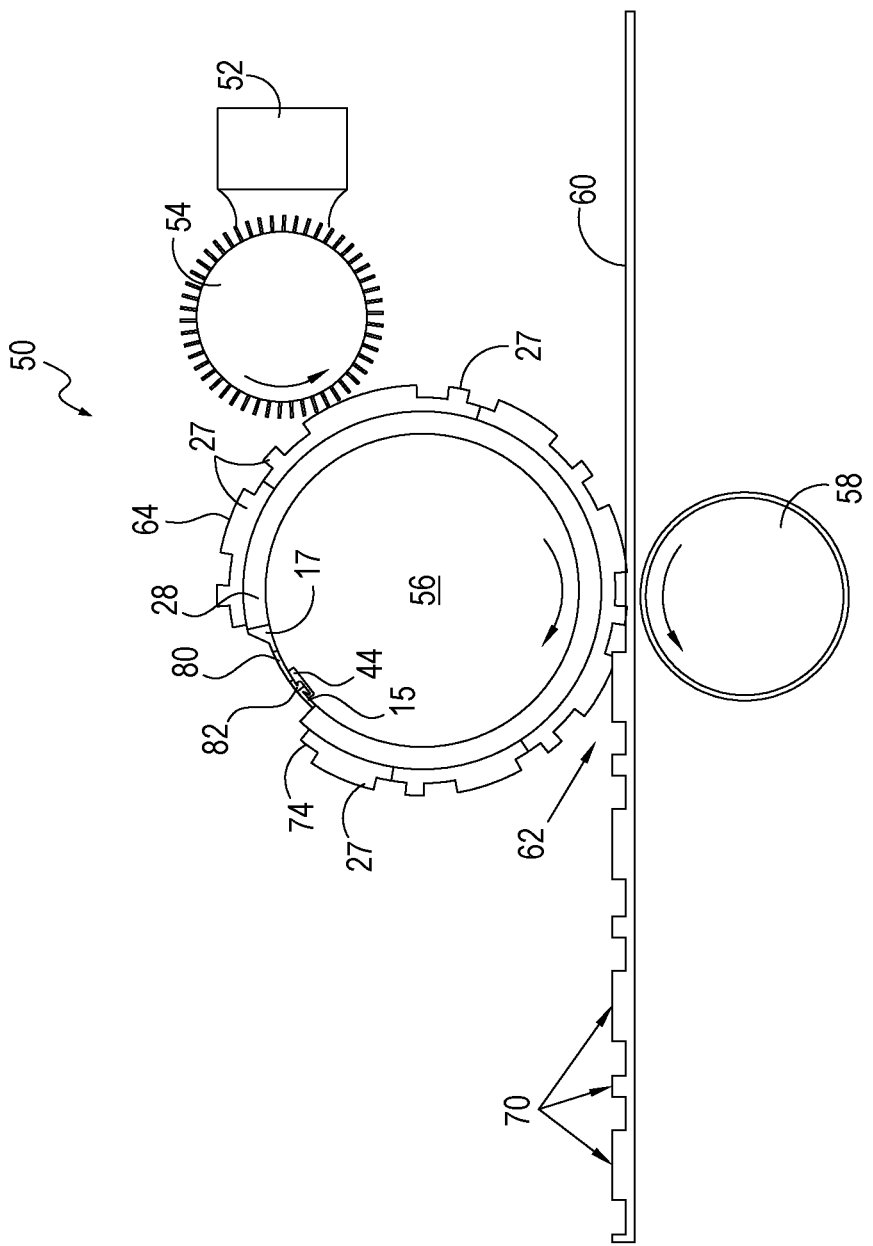
FIG. 6 is a very simplified diagrammatic drawing showing the main components of a typical flexographic printer on which the flexographic printing process of the invention can be implemented.

With reference to FIG. 6, the main components of a typical flexographic printer on which the flexographic printing process of the invention can be implemented, are shown diagrammatically. Depicted is a top side printing cylinder (56), though any orientation, for example, bottom side, can also be utilized. In conventional fashion, the flexographic printer, generally indicated by reference numeral (50), comprises an ink supply (52), an anilox roll (54) and a printing cylinder (56) (often a plurality of such cylinders, e.g., up to ten, one for each color ink, are used). When multiple printing cylinders (56) are utilized, they are placed in series, to print one color after another, yielding a finished print after processing through all of the printing cylinders (56). A corrugated flexographic printing plate, such as the processed corrugated flexographic printing plate (74), containing a plurality of processed flexible relief printing plates (27) prepared in accordance with the invention (but shown in FIG. 6 with many more than two imaged and processed, processed flexible relief printing plates [27] attached to the dimensionally stable backing sheet [28]), is wrapped around the printing cylinder (56). The wrapping replicates the wrapping by position and tension as was used for the imaging of the plate on the imaging cylinder (45). By securing the lead edge strip (15) to the lead edge lock formation (46) and the trail edge strip (17) to the trail edge lock formation (49), just as was done during imaging, the same positioning and tension are recreated. Thus, the precision and print quality can be dramatically improved. The flexographic printer (50) also includes an impression cylinder (58).

A substrate (60) on which images from the processed flexible relief printing plate (74) are to be printed, is fed through a nip opening (62) defined between the cylinder (56) and the impression cylinder (58), which in use are counter-rotating.

In use, ink from the ink supply (52) is transferred to the anilox roll (54), and from the anilox roll (54) onto raised surfaces (64) of the processed flexible relief printing plate (27) of the processed corrugated flexographic printing plate (74) wrapped around the cylinder (56), from where the ink is transferred, as the cylinder (56) and the impression cylinder (58) are rotated in opposite directions to feed the substrate (60) through the nip opening (62), to the substrate (60) to leave printed images (70) (shown greatly exaggerated in thickness in FIG. 6) on the substrate (60). When a final image requires several different ink colors, several plates and printing cylinders (56) will be in series to generate a finished printed image.

In the preferred embodiments, advantageously, once a corrugated flexographic printing plate such as the processed corrugated flexographic printing plate (74) has been prepared in accordance with the method of the invention, the processed corrugated flexographic printing plate (74) is mounted to the printing cylinder (56) of the flexographic printer (50) using the same lead edge strip (15) of the original corrugated flexographic printing plate (34), mounted with unprocessed flexographic printing plate (10) used to image and prepare the processed flexible relief printing plate (74). The lead edge strip (15) is simply locked or hooked to a conventional lead edge lock formation (46) carried by or defined by the printing cylinder (56) of the flexographic printer (50). The lead edge lock formation (46) of the cylinder (56) is identical to the lead edge lock formation of the flexographic imaging machine cylinder (45) of the flexographic imaging machine. Indeed, in certain embodiments, it may be suitable to utilize a single cylinder, which can be both used for imaging and printing and moved from one location to another.

The processed corrugated flexographic printing plate (74) is usually mounted to be exactly in position relative to a center line on the printing cylinder (56) of the flexographic printer (50). Typically, the printing cylinder (56) has an engraved or marked center line (not shown). Thus, because the image was processed with the lead edge strip (15), a trail edge strip (17) and a known tension, by locking the processed corrugated flexographic printing plate (74) into the same position with the same tension as is used in the actual printing process, the opportunity for introduction of error in alignment is reduced or eliminated, yielding superior printing results.

Therefore, the above details a method of preparing a processed flexible relief printing plate (27) suitable for use in flexographic printing, a flexographic printing process, a processed corrugated flexographic printing plate (74) and a flexographic imaging machine (50) that do not suffer from, or which are less vulnerable to, the potential misalignment problems hereinbefore described, will be desirable.

According to one aspect of the invention, there is provided a method of preparing a processed flexible relief printing plate (27) suitable for use in flexographic printing, the method including: (a) wrapping a corrugated flexographic printing plate (34) comprising a dimensionally stable backing sheet (28) and at least one unimaged and unprocessed flexographic printing plate (10) attached to the dimensionally stable backing sheet (28), around a flexographic imaging cylinder (45) of an imaging machine, by securing a locking lead edge strip (15) along a lead edge of the dimensionally stable backing sheet (28) to a lead edge lock formation (46) and locking a trail edge strip (17) to a trail edge lock formation (49); and (b) imaging and processing said at least one flexographic printing plate (10), providing a negative or mirror, relief image of processed sheet photopolymer layer (19) for flexographic printing purposes.

The invention advantageously thus provides for a mounting and tensioning system that comprises the mounting of a lead edge strip (15) and a trail edge strip (17) to a corrugated flexographic printing plate (34) or a rigid corrugated flexographic printing plate (40), prior to imaging and processing the flexographic printing plate (10) mounted on the corrugated flexographic printing plate (34) or the rigid flexographic printing plate (42) mounted on the rigid corrugated flexographic printing plate (40). The use of lead edge strip (15) and trail edge strip (17) with a known tension and placed on an imaging cylinder (45) and then on a printing cylinder (56) allows a replication of the position and tension of the processed plate, so as to generate superior printing capabilities. Whereas mounting of lead edge strip (15) conventionally was done post processing, the invention defines that such mounting be done preprocessing before imaging is completed.

Thus, a method of the present disclosure comprises imaging and processing said at least one corrugated flexographic printing plate (34) or rigid corrugated flexographic printing plate (40) comprises: (a) imaging said at least one flexographic printing plate (10) or at least one rigid flexographic printing plate (42) by securing a flexographic printing plate to a printing cylinder by attaching a lead edge strip (15) and a trail edge strip (17) to a lead edge lock formation and a trail edge lock formation positioned on an imaging cylinder and imaging said printing plate with the imaging machine; (b) unlocking the lead edge anchor formation of the imaged corrugated flexographic printing plate (34) or the rigid corrugated flexographic printing plate (40) from the lead edge lock formation (46) of the flexographic imaging machine cylinder (45) of the imaging machine; (c) and unlocking the trail edge anchor formation of the imaged corrugated flexographic printing plate (34) or the rigid corrugated flexographic printing plate (40) from the trail edge lock formation (49) of the flexographic imaging machine cylinder (45) of the imaging machine; (d) removing the imaged corrugated flexographic printing plate (34) or the imaged rigid corrugated flexographic printing plate (40) from the flexographic imaging machine cylinder (45) of the imaging machine; and (e) processing the imaged corrugated flexographic printing plate (34) to transform the flexographic printing plate (10) into a processed flexible relief printing plate (27) or processing the rigid flexographic printing plate (42) from the rigid corrugated flexographic printing plate (40).

The processing step comprises wherein the photopolymer or resin of a sheet photopolymer layer (16) of said at least one unimaged and unprocessed flexographic printing plate (10) or rigid flexographic printing plate (42) may be configured, after UV light exposure, to form an image of cured photopolymer, with uncured photopolymer being removable by water washing, solvent washing (e.g., using perchloroethylene alternative solvents), or heat treatment. Processing the imaged flexographic printing plate (10) to provide said processed flexible relief printing plate (27) may thus include processing the imaged flexographic printing plate (10) in a washing out machine or in a heat treatment machine to remove uncured photopolymer. Optionally, the method includes drying the processed flexible relief printing plate (27). Optionally, the method includes exposing the dried processed flexible relief printing plate (27) to UV light to eliminate tackiness, wherein a processed corrugated flexographic printing plate (74) is defined through the above steps.

Finally, with a processed corrugated flexographic printing plate (74) there is provided a flexographic printing process, which includes: (a) mounting the processed corrugated flexographic printing plate (74) to a printing cylinder (56) of a flexographic printer (50) wherein mounting the processed corrugated flexographic printing plate (74) to the cylinder (56) of the flexographic printer (50) includes locking a lead edge anchor formation positioned along a lead edge of the processed corrugated flexographic printing plate (74) to a lead edge lock formation (46) carried by or defined by the printing cylinder (56) of the flexographic printer (50), the lead edge anchor formation of the corrugated flexographic printing plate (34) being the same lead edge anchor formation used to lock the corrugated flexographic printing plate (34) to the lead edge lock formation (46) carried by or defined by the flexographic imaging machine cylinder (45) of the imaging machine; and (b) operating the flexographic printer (50) to transfer an inked image from the processed flexible relief printing plate (27) to a printable substrate.

Mounting the processed corrugated flexographic printing plate (74) or the processed rigid corrugated flexographic printing plate (140) to the printing cylinder (56) of the flexographic printer (50) may include locking a trail edge anchor formation positioned along a trail edge of the processed corrugated flexographic printing plate (74) or the processed rigid corrugated flexographic printing plate (140) to a trail edge lock formation (49) carried by or defined by the cylinder (56) of the flexographic printer (50), the trail edge anchor formation of the processed corrugated flexographic printing plate (74) or the processed rigid corrugated flexographic printing plate (140) being the same trail edge anchor formation used to lock the processed corrugated flexographic printing plate (74) or the processed rigid corrugated flexographic printing plate (140) to the trail edge lock formation (49) carried by or defined by the flexographic imaging machine cylinder (45) of the imaging machine.

The flexographic printing process may include preparing two or more processed corrugated flexographic printing plates (74) or the processed rigid corrugated flexographic printing plate (140) suitable for use in flexographic printing, using a method in accordance with the invention as hereinbefore described, mounting the processed corrugated flexographic printing plates (74) or the processed rigid corrugated flexographic printing plate (140) each to an associated cylinder (56) of a flexographic printer (50), and operating the flexographic printer (50) to transfer an inked image from the processed flexible relief printing plates (27) to a substrate (60), with each processed flexible relief printing plate (27) transferring an image in a different color ink. When two or more processed corrugated flexographic printing plates (74) or the processed rigid corrugated flexographic printing plates (140) are used, each processed corrugated flexographic printing plate (74) or the processed rigid corrugated flexographic printing plate (140) is mounted to its associated printing cylinder (56) of the flexographic printer (50) by locking a lead edge anchor formation positioned along a lead edge of the processed corrugated flexographic printing plate (74) or the processed rigid corrugated flexographic printing plate (140) to a lock formation carried by or defined by its associated printing cylinder (56) of the flexographic printer (50), the lead edge anchor formation of each processed corrugated flexographic printing plate (74) or the processed rigid corrugated flexographic printing plate (140) being the same lead edge anchor formation used to lock the processed corrugated flexographic printing plate (74) or the processed rigid corrugated flexographic printing plate (140) to the lock formation carried by or defined by the flexographic imaging machine cylinder (45) of the imaging machine.

When two or more processed corrugated flexographic printing plates (74) or processed rigid corrugated flexographic printing plates (140) are used, each processed corrugated flexographic printing plate (74) or processed rigid corrugated flexographic printing plate (140) may be mounted to its associated cylinder (56) of the flexographic printer (50) by locking a trail edge anchor formation positioned along a trail edge of the processed corrugated flexographic printing plate (74) or the rigid corrugated flexographic printing plate (40) to a trail edge lock formation (49) carried by or defined by its associated cylinder (56) of the flexographic printer (50), the trail edge anchor formation of each processed corrugated flexographic printing plate (74) or the processed rigid corrugated flexographic printing plate (140) being the same trail edge anchor formation used to lock the processed corrugated flexographic printing plate (74) or the processed rigid corrugated flexographic printing plate (140) to the trail edge lock formation (49) carried by or defined by the flexographic imaging machine cylinder (45) of the imaging machine.

In one embodiment of the invention, if the corrugated flexographic printing plate (34) used to prepare the flexographic printing plate (10) into a processed flexible relief printing plate (27) did not include a trail edge strip (17), a trail edge strip (17) is then attached to the dimensionally stable backing sheet (28) of the corrugated flexographic printing plate (34), so that the trail edge of the dimensionally stable backing sheet (28) can be attached to a trail edge lock formation of a trail edge mounting system (not shown in FIG. 5) of the cylinder (56), in conventional fashion.

Figure 7:
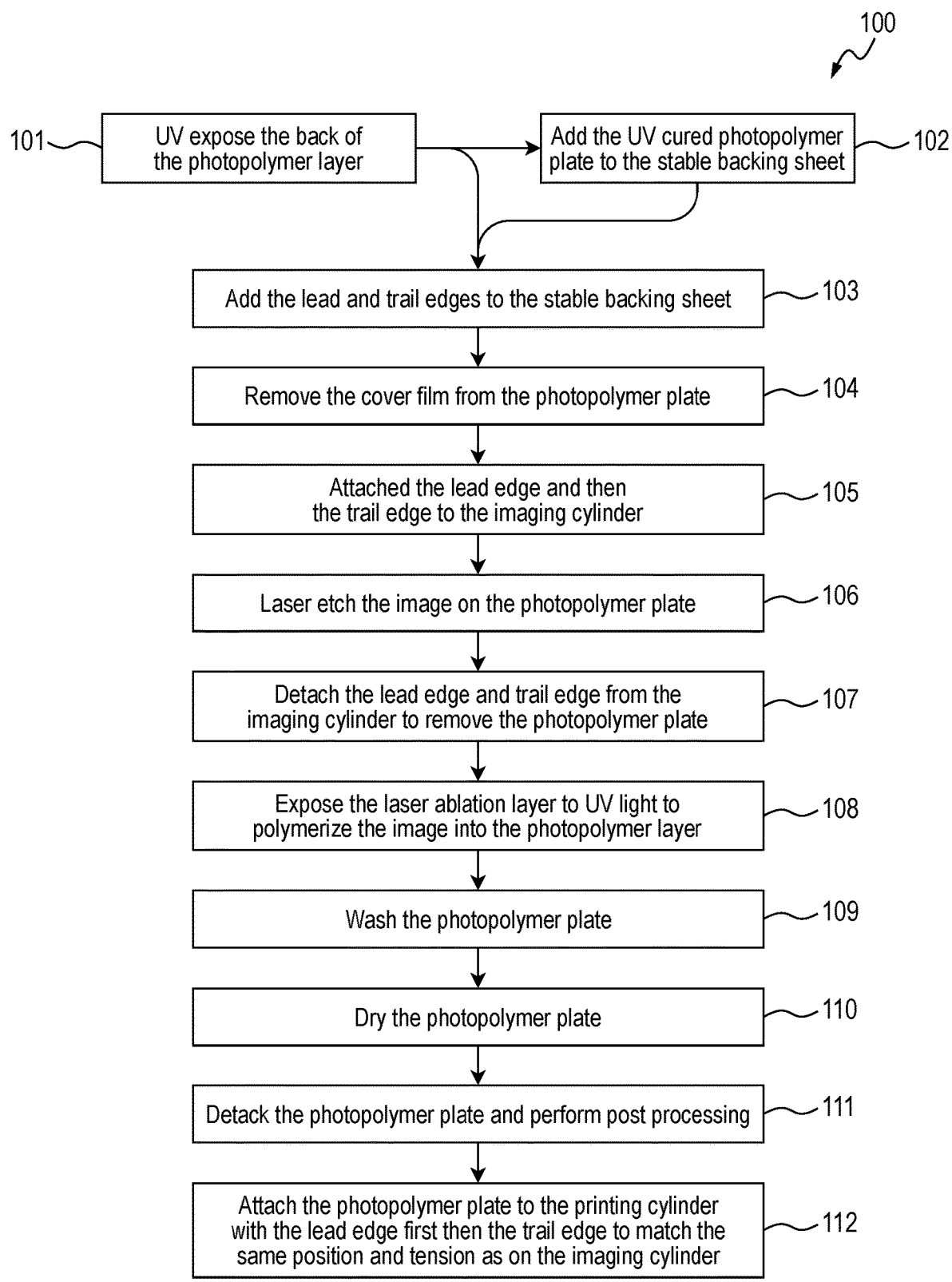
FIG. 7 depicts a flow diagram of an embodiment of a method of producing an improved image by using an imaging machine comprising the same machine mounting formation as the printing machine.

FIG. 7 provides a flow diagram (100) of an embodiment for flexographic printing according to the present disclosure. The initial step is to UV expose the back of the photopolymer layer (101). In certain orientations, different sheets can be utilized, one such sheet is step (102) which is adding the UV cured photopolymer plate to a stable backing sheet. Step (103) then adds lead and trail edges to the stable backing sheet, and then step (104) removes the cover film from the photopolymer plate. Step (105) then attaches the lead and trail edges of the plate to the cylinder. Step (106) then laser etches the image onto the photopolymer plate. Step (107) then removes the photopolymer plate from the imaging cylinder, with step (108) then exposing the laser ablation layer to UV light to polymerize the photopolymer layer. Step (109) then requires a wash of the photopolymer plate, with step (110) then drying the plate. Step (111) is a detacking step, with step (112) then attaching the plate to a printing cylinder, with the lead edge and trail edge to match the position and tension from the imaging cylinder. Upon completion, and after setting up each color plate, the printer is ready to be utilized.

According to yet another aspect of the invention, there is provided a flexographic imaging machine which includes a flexographic imaging machine cylinder (45) around which a flexographic printing plate (10) comprising a dimensionally stable backing sheet (28), at least one unimaged and unprocessed flexographic printing plate (10) attached to the dimensionally stable backing sheet (28) and a lead edge anchor formation positioned along a lead edge of the dimensionally stable backing sheet (28), can be wrapped, the flexographic imaging machine cylinder (45) including or defining a lead edge lock formation (46) to lock the lead edge anchor formation of the corrugated flexographic printing plate (34) in position on the flexographic imaging machine cylinder (45) of the imaging machine.

The flexographic imaging machine (i.e., a so called flexo imagesetter or flexo plate imager or flexo plate maker) may be a computer-to-plate imaging machine, e.g., an inkjet computer-to-plate imaging machine or a thermal imagesetter or a computer-to-plate laser imaging machine. In a preferred embodiment of the invention, the flexographic imaging machine is a computer-to-plate laser imaging machine, i.e., a laser ablation device.

It is to be appreciated that the flexographic imaging machine of the invention may in all respects be a conventional flexographic imaging machine, other than in that the flexographic imaging machine cylinder (45) of the flexographic imaging machine of the invention is modified to incorporate or define a lead edge lock formation (46) to lock at least a lead edge anchor formation of a corrugated flexographic printing plate (34) or a rigid corrugated flexographic printing plate (40) in position on the flexographic imaging machine cylinder (45) of the imaging machine. Refer to FIG. 3B. Preferably, the imaging cylinder (45) further comprises a trail edge lock formation (49) to secure a trail edge strip (17) from the flexographic plate.

It is also envisaged that the flexographic imaging machine of the invention may be larger than a conventional flexographic imaging machine, with the flexographic imaging machine cylinder (45) around which a corrugated flexographic printing plate (34) comprising a dimensionally stable backing sheet (28), at least one unimaged and unprocessed flexographic printing plate (10) attached to the dimensionally stable backing sheet (28) and a lead edge anchor formation positioned along a lead edge of the dimensionally stable backing sheet (28), can be wrapped, being longer and/or being of increased circumference, e.g., having a length in some embodiments of 2,600 mm or longer, and/or a circumference in some embodiments of 1,700 mm or more.

The lead edge lock formation (46) of the flexographic imaging machine cylinder (45) of the flexographic imaging machine may be configured also to act as part of a trail edge mounting system to fasten or attach a trail edge anchoring or fastening formation positioned along a trail edge of a dimensionally stable backing sheet (28) to the flexographic imaging machine cylinder (45).

The lead edge lock formation (46) may be defined by a formation or component recessed into a surface (47) of the flexographic imaging machine cylinder (45) of the flexographic imaging machine, e.g., comprising a longitudinal slot comprising a mounting bar (44) or other component of a machine mounting formation (30) on the imaging machine cylinder (45). The lead edge lock formation (46) may be a conventional component of a conventional lead edge mounting system, such as those hereinbefore described.

The flexographic imaging machine cylinder (45) of the flexographic imaging machine of the invention may include or define more than one type of lead edge lock formation (46), so that the flexographic imaging machine cylinder (45) can accommodate corrugated flexographic printing plates (34) or rigid corrugated flexographic printing plates (40) with different types of lead edge anchor formations.

In a further embodiment, the invention further comprises a flexographic printing plate (10), which is an uncured portion of material, comprising several different layers, with some of the layers being optional and/or removable, in order to facilitate securing the flexographic printing plate (10) into position on a dimensionally stable backing sheet (28), or to impart an image onto the flexographic printing plate (10). In the embodiment, from top to bottom, comprises the following layers: a protective cover film (12) which is removable or peelable; a laser ablation layer (14); a sheet photopolymer layer (16); a pliable adhesive layer (18); a compressible layer (20); and a backing adhesive layer (22), wherein said backing adhesive layer is secured to a dimensionally stable backing sheet (28). In preferred embodiments, wherein the dimensionally stable backing sheet comprises a lead edge strip (15) and a trail edge strip (17) suitable for securing said dimensionally stable backing sheet (28) to a cylinder as detailed herein.

In a preferred embodiment, there is provided a flexographic printing plate (10) which includes: a sheet photopolymer layer (16) and a compressible layer (20) attached or bonded to the sheet photopolymer layer (16), with a pliable adhesive layer (18) and without an intervening second dimensionally stable slug backing material (23). Wherein the sheet photopolymer layer has a top side (16.1) for receiving an image and a bottom side (16.2) which is precured to be secured to said compressible layer (20).

The embodiments herein described may be modified by those of ordinary skill in the art with interchangeable parts and components without deviating from the scope of the invention.

What is claimed is:

1. A method for flexographic printing comprising:
   a. attaching a portion of photopolymer to a dimensionally stable backing sheet;
   b. attaching a lead edge strip and a trail edge strip to said dimensionally stable backing sheet to form a flexographic printing plate wherein the trail edge strip comprises a plurality of apertures;
   c. securing the flexographic printing plate comprising a portion of photopolymer to an imaging cylinder by securing the lead edge strip to a lead edge lock formation and securing said trail edge strip to a trail edge lock formation, wherein securing said trail edge strip to said trail edge lock formation comprises securing into at least one aperture a trail aperture prong, and attached to said trail aperture prong is a tensioning band wherein said tensioning band is further secured to a trail hook comprising a trail edge prong, and wherein said trail edge prong is secured to said trail edge lock formation;
   d. imparting an image to said portion of photopolymer;
   e. washing said photopolymer to remove unreacted photopolymer and drying said photopolymer to form a processed flexographic printing plate;
   f. attaching said processed flexographic printing plate to a printing cylinder, wherein said lead edge strip is secured to a lead edge lock formation and said trail edge strip is secured to a trail edge lock formation that replicates the attachment from the imaging cylinder; and
   g. printing an image onto a substrate by pressing said processed flexographic printing plate to said substrate with an ink.

2. The method of claim 1 wherein the washing and drying step further comprises a detacking step.

3. The method of claim 1 wherein the lead edge strip comprises a lead edge prong, said lead edge prong engaging with a lead edge lock formation on each of the imaging cylinder and the printing cylinder.

4. The method of claim 1 wherein the portion of photopolymer is a flexographic printing plate, wherein before imaging, said flexographic printing plate comprises a laser ablation layer, a sheet photopolymer layer, and a compressible layer, and wherein said compressible layer is secured to said dimensionally stable backing sheet.

5. The method of claim 1 wherein the lead edge lock formation and trail edge lock formation are formed on a mounting bar positioned within a longitudinal slot in said imaging cylinder or said printing cylinder.

6. The method of claim 4 comprising at least two flexographic printing plates disposed on said dimensionally stable backing sheet.

7. The method of claim 4 wherein the portion of photopolymer comprises a top side and a bottom side and wherein the bottom side is UV cured before being attached to a compressible layer and the compressible layer is attached to the dimensionally stable backing sheet.

8. The method of claim 1 wherein the lead edge lock formation and trail edge lock formation on each of the imaging cylinder and the printing cylinder are equivalent.

9. The method of claim 8 wherein the equivalent lead edge lock formation and trail edge lock formation allow for a reproduction of the position and tension of the flexographic printing plate on each of the imaging cylinder and the printing cylinder.

10. The method of claim 1 wherein imparting said image to said portion of photopolymer is performed by laser ablating an image into a laser ablation layer and UV curing the photopolymer.

11. A method of forming a digital image on a flexographic printing plate comprising:
   a. attaching a portion of photopolymer to a dimensionally stable backing sheet;
   b. attaching a lead edge strip and a trail edge strip to said dimensionally stable backing sheet to form a flexographic printing plate wherein the trail edge strip comprises a plurality of apertures;
   c. securing the flexographic printing plate comprising a portion of photopolymer to an imaging cylinder by securing the lead edge strip to a lead edge lock formation and securing said trail edge strip to a trail edge lock formation, wherein securing said trail edge strip to said trail edge lock formation comprises securing into at least one aperture a trail aperture prong, and attached to said trail aperture prong is a tensioning band wherein said tensioning band is further secured to a trail hook comprising a trail edge prong, and wherein said trail edge prong is secured to said trail edge lock formation;
   d. imparting an image to said portion of photopolymer; and
   e. washing said photopolymer to remove unreacted photopolymer and drying said photopolymer to form a processed flexographic printing plate.

12. The method of claim 11 wherein the washing and drying step further comprises a detacking step.

13. The method of claim 11 wherein the lead edge strip comprises a lead edge prong, said lead edge prong engaging with a lead edge lock formation on the imaging cylinder.

14. The method of claim 11 wherein the portion of photopolymer is a flexographic printing plate, wherein before imaging, said flexographic printing plate comprises a laser ablation layer, a sheet photopolymer layer, and a compressible layer, and wherein said compressible layer is secured to said dimensionally stable backing sheet.

15. The method of claim 11 wherein the portion of photopolymer comprises a top side and a bottom side and wherein the bottom side is UV cured before being attached to a compressible layer and the compressible layer is attached to the dimensionally stable backing sheet.

16. The method of claim 14 comprising at least two flexographic printing plates disposed on said dimensionally stable backing sheet.

17. The method of claim 11 wherein imparting said image to said portion of photopolymer is performed by laser ablating an image into a laser ablation layer and UV curing the photopolymer.

* * * * *